United States Patent [19]

Heinze et al.

[11] Patent Number: 4,748,404

[45] Date of Patent: May 31, 1988

[54] DIGITAL MEASURING DEVICE FOR THE QUASI-ANALOG INDICATION OF MEASUREMENT VALUES

[75] Inventors: Siegfried Heinze, Nuremberg; Werner Haüssel, Feucht; Reinhold Kern, Neumarkt; Günter Roppelt, Nuremberg, all of Fed. Rep. of Germany

[73] Assignee: Brown, Boveri & Cie. AG, Mannheim-Käfertal, Fed. Rep. of Germany

[21] Appl. No.: 830,067

[22] Filed: Feb. 14, 1986

Related U.S. Application Data

[63] Continuation-in-part of Ser. No. 708,346, Mar. 5, 1985, abandoned.

[30] Foreign Application Priority Data

Mar. 5, 1984 [DE] Fed. Rep. of Germany ....... 3408026

[51] Int. Cl.[4] .................. G01R 1/00; G01R 19/00; G01R 15/08
[52] U.S. Cl. ........................... 324/114; 324/96; 324/115
[58] Field of Search ............... 324/114, 115, 99 D, 324/96, 122

[56] References Cited

U.S. PATENT DOCUMENTS

| | | | |
|---|---|---|---|
| 3,619,574 | 11/1971 | Mindheim | 324/99 D |
| 3,689,835 | 9/1972 | Bickford | 324/114 |
| 4,115,733 | 9/1978 | Silberberg | 324/114 |
| 4,251,769 | 2/1981 | Ewert et al. | 324/96 |
| 4,415,855 | 11/1983 | Dubauskas | 324/114 |
| 4,520,310 | 5/1985 | Kelly et al. | 324/115 |
| 4,567,466 | 1/1986 | Bozarth et al. | 324/115 |
| 4,608,532 | 8/1986 | Ibar et al. | 324/115 |

FOREIGN PATENT DOCUMENTS

| | | |
|---|---|---|
| 0092486 | 10/1983 | European Pat. Off. . |
| 6806498 | 11/1968 | Fed. Rep. of Germany . |
| 2450292 | 5/1975 | Fed. Rep. of Germany . |
| 2609976 | 11/1976 | Fed. Rep. of Germany . |
| 2615459 | 3/1977 | Fed. Rep. of Germany . |
| 2904758 | 8/1980 | Fed. Rep. of Germany . |
| 3035167 | 5/1982 | Fed. Rep. of Germany . |
| 3238487 | 6/1983 | Fed. Rep. of Germany . |
| 2939801 | 10/1984 | Fed. Rep. of Germany . |

Primary Examiner—Ernest F. Karlsen
Attorney, Agent, or Firm—Herbert L. Lerner; Laurence A. Greenberg

[57] ABSTRACT

A digital measuring device for a quasi-analog measurement value indication includes a display for the measurement value indication, a pre-determined overall measuring range disposed on the display, a measurement value scale forming a spread measuring range section of the overall measuring range with variable spreading, the measuring value scale being addressable in planar segments with alpha numeric characters, an indicating device for indicating a value on the measuring value scale, and an automatic control placing measurement values within the displayed measuring range section with numerically displayed scale values fitting the measuring range section, with the overall measuring range remaining constant and the measuring range section having a selected spreading factor.

22 Claims, 10 Drawing Sheets

MICROPROCR. 2 MAIN PROGRAM
AUTOZOOM PART 2

DIGITAL MEASURING DEVICE FOR THE QUASI-ANALOG INDICATION OF MEASUREMENT VALUES

This is a continuation-in-part of application Ser. No. 708,346, filed Mar. 5, 1985, now abandoned.

The invention relates to a digital measuring device for a quasi-analog measurement value indication on a display, on which a measurement-value scale addressable by planar segments with lettering and a pointer mark or bar indication can be shown, the measurement-value scale representing a spread measuring range section of a predetermined overall measuring range.

An important advantage of digital measuring devices over analog measuring devices is that their indication accuracy can be increased almost arbitrarily. In order to improve the indication accuracy, it is not necessary to extend the scale which has narrow limits set by the size of the measuring device, as it is in analog measuring devices. Instead, the numerical indication must merely be extended by one or more digits. It is also an advantage of digital devices that an existing numerical indication can be read without difficulty down to the last digit, while an analog indication can readily lead to reading errors due to parallax errors or incorrect evaluation of the scale relative to the set measuring range.

However, the advantages of a numerical indication are balanced by disadvantages as soon as the measurement value has dynamic instead of static behavior. Changes of the measurement value lead to a continuous change of the numerical indication, which the eye of the observer cannot follow, neither for ascertaining the instantaneous absolute value nor the travel of the change. In this respect, the analog indication in which the instantaneous position of the measurement pointer can be determined with one glance and the coarse absolute value as well as the trend of the change can be visualized, is seen to be superior.

Therefore, a multitude of measuring devices have become known, in which a numerical indication is combined with an analog indication in order to combine the advantages of both types of indications. However, it has been found to be advantageous to replace the relatively sensitive electromagnetic analog measuring mechanisms by electronic displays with a quasi-analog indication. Such a display is formed of several light-emitting diodes or liquid crystal segments which are aligned in chain-fashion and which can be addressed individually through an electronic circuit as is described, for instance, in German Pat. DE-PS No. 21 41 361. Liquid crystals are preferred not only because of their low power consumption but also because the individually addressable planar segments have the advantage of having a shape which is able to be adapted almost arbitrarily to the application in question.

For simulating a given pointer position, the planar segment of a liquid-crystal display is addressed which has a position that comes the closest to the pointer position to be simulated. If all preceding planar segments are addressed and not only this one planar segment, this is called a bar display or a band display, which makes the measurement value readable from a greater distance.

German Published, Non-Prosecuted application DE-OS No. 32 38 487 shows a digital measuring device which likewise has a liquid crystal display for quasi-analog indication, but additionally improves the reading accuracy by spreading out the display of a partial range. The spreading-out in the range of a desired value, preferably a range in the center of the scale, makes it easy to see whether or not the measured value approaches the desired value, even in the case of small changes of the measurement value.

The prior art measuring device is fixed to a reference value with respect to its spread-out measuring range section and is therefore not suitable for normal measurements which are independent of the reference value, if only for the reason that the measurement value cannot be read in absolute values but is shown as a percentage deviation. It is furthermore a disadvantage of such a device that only one spread-out measuring range section is provided. The spread-out section may either be spread out too little, so that the resolution is not sufficient for observing the change of the measurement value, or it may be spread so much that the measurement value lies outside the measurement range section.

It is accordingly an object of the invention to provide a digital measuring device for quasi-analog indication of measurement values, which overcomes the hereinafore-mentioned disadvantages of the heretofore-known devices of this general type, and which allows the observation of trends of very small as well as large measurement value changes as well as the determination of the absolute measurement value within the chosen measuring range.

With the foregoing and other objects in view there is provided, in accordance with the invention, a digital measuring device for a quasi-analog measurement value indication, comprising a display for the measurement value indication, a pre-determined overall measuring range disposed on the display, a measurement value scale forming a spread measuring range section of the overall measuring range with variable spreading, the measuring value scale being addressable in planar segments with lettering, an indicating device for indicating a value on the measuring value scale, and an automatic control switching automatically for placing measurement values within the displayed measuring range section with numerically displayed scale values fitting the measuring range section, with the overall measuring range remaining constant and the measuring range section having a spreading factor selected by hand or by the automatic control.

The invention permits the visualization of even very small changes of the measurement value through the selection of an advantageous spreading factor for the measuring-range section. Nevertheless, large measurement value changes which would lead to exceeding the initially chosen measurement range section, are also kept in view by reducing the spreading and/or by automatic switching of the measurement range section.

Through an advantageous further embodiment of the invention, switching back and forth from one measurement range section to the next is prevented in the event of a measurement value which oscillates at the limit of the range. If the measurement value exceeds the beginning or the end of the measurement range section, it reaches the center of the adjoining measurement range section and not its end or start. The measurement range sections are therefore switched in such a way that they always overlap halfway.

The above-described measure can be aided further by the provision that the switching does not occur spontaneously as soon as the measurement value reaches the upper or lower limit of the measuring range section, but only when it has already exceeded one of the two limits for a certain predeterminable time.

The correct choice of the spreading factor is of great importance so that an observer can observe the trend of a measurement value change. An advantageous further embodiment of the invention therefore provides that the automatic control optimizes the spreading factor to be set in such a way that it covers the measurement value changes per unit time and only spreads the measuring range section so far that the measurement value does not exceed the measurement range section in a predeterminable time, for the same rate of change. This ensures that the spread is chosen neither too large nor too small.

A further embodiment of the invention provides that not only the following of measurement value changes which cannot be influenced, but also the setting to a predetermined reference value is facilitated by the automatic control. For this purpose, the reference value is positioned in the center of the scale of the measuring range section. The automatic control ensures that the spreading factor is changed in steps in such a way that the measurement value lying within the measurement range section is at the largest possible respective distance from the reference value. To the extent to which the measurement value approaches the reference value during balancing, the spreading factor is increased automatically and thereby facilitates the balancing. An undesirably frequent switching of the spreading factor as well as an excessively large spreading factor can be avoided by setting these parameters by hand.

If the measurement range section is slaved to the measurement value by the automatic control, and therefore the measurement value always remains visible within the set total measuring range, it is also advantageous to visualize the overall measuring range besides the measurement range section. On one hand, this is possible by imaging a second scale for the overall measuring range parallel to the spread measuring range section. However, it is even more advantageous to display both measuring ranges on a common scale. It is advantageous to be able to evaluate the measurement value if it lies outside of the measuring range section, especially if one works with a delay time for switching the measuring range sections.

The electronic circuit of the measuring device is advantageously constructed in such a way that a measuring value input unit is provided which serves for adapting the measuring value, and the output signal thereof is directly fed for determining the range parameters, and is also fed through a matching circuit and an A/D converter, to a microcomputer. The microcomputer causes a conversion of the measurement value into individual control signals required for activating the planar segments of the display, which it feeds to the display through a display driver. Parameters such as the mode of operation, the measuring range, the factor for the spreading of the measuring range section and other criteria determining the addressing of the planar segments, are fed into the microcomputer through an operating or control unit.

In order to show the scale with lettering and the pointer mark on a display, the display can be constructed in rather different ways. Normally, liquid crystals are used which are subdivided into a multiplicity of individual planar segments and can be addressed, for instance, by a matrix. All of the planar segments are of the same size in this case and are provided approximately in dot form. Such a matrix control technique has the advantage of being able to display practically any images, the quality of which is limited only by the resolution of the dot raster. A disadvantage, however, is the high circuitry cost for the addressing circuitry and the complicated construction of the display. A substantial simplification can be achieved if the planar segments of the display have a form matched to the predetermined scale variants and are partly constructed in very different ways with respect to their areas. The number of planar segments to be addressed can therefore be reduced considerably. As compared with the matrix control technique, at the same time it is possible to make do with a considerably lower multiplex rate and nevertheless use fewer input lines.

A further simplification of the control circuitry can be achieved if the scale has a fixed scale division which remains the same independently of the chosen overall measuring range and the respective measurement range section. Only the length of the scale lines and the lettering of the scales is subjected to change for adaptation to the respective measuring range. The non-variable parts of the scale can be addressed jointly in this case or can be given permanently in print.

The planar segments which can be addressed for displaying the pointer mark lie side by side and parallel with the same spacing from the beginning to the end of the scale. The number and position of these planar segments is chosen in such a way that a planar segment for the pointer mark lies at every division line of the scale and further planar segments are disposed between the division lines.

For better readability, a linear division for the jumps of the pointer mark are provided in the measuring range section as well as in the overall measuring range enclosing it. However, in the region of the measuring range section, this involves linear spreading within and linear compression outside, its limits. If the total measuring range is exceeded, this is signaled by an overflow mark.

In order for the amount of circuitry for addressing the display to be held within limits, only the starting and ending values of the measuring range section as well as of the overall measuring range and of the center value of the scale in general, are displayed by alpha-numeric symbols characterizing the measuring range. An additional numerical display with a substantially larger area above or below the scale serves for indicating the instantaneous measurement value, i.e. the actual value.

Assuming a permanently given scale with a variable length of the scale lines, an automatic scale matching ensures that if the longer scale marks lie at a point where the measuring range is switched, the longer scale lines will lie at a point which ensures an easily readable subdivision of the set measuring range. The automatic scale matching further ensures that after a coarse setting of the spreading factor by hand or an automatic setting as a function of certain parameters, a fine adjustment is made in such a way that the measuring range section being displayed fits the predetermined fixed scale division.

The matching of the scale division and lettering to the respective measuring range leads to a substantial simplification of the measuring value reading. This is because it is no longer necessary for one of several scales of the multiple measuring device ("multimeter") to be correlated and valued correctly as to the measuring range and the measurement quantity. Only one scale is displayed at a time independently of the number and type of measuring ranges and measuring quantities, and the scale has a scale division laid out in such a manner that optimum readability is assured in every case.

Other features which are considered as characteristic for the invention are set forth in the appended claims.

Although the invention is illustrated and described herein as embodied in a digital measuring device for the quasi-analog indication of measurement values, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 1:
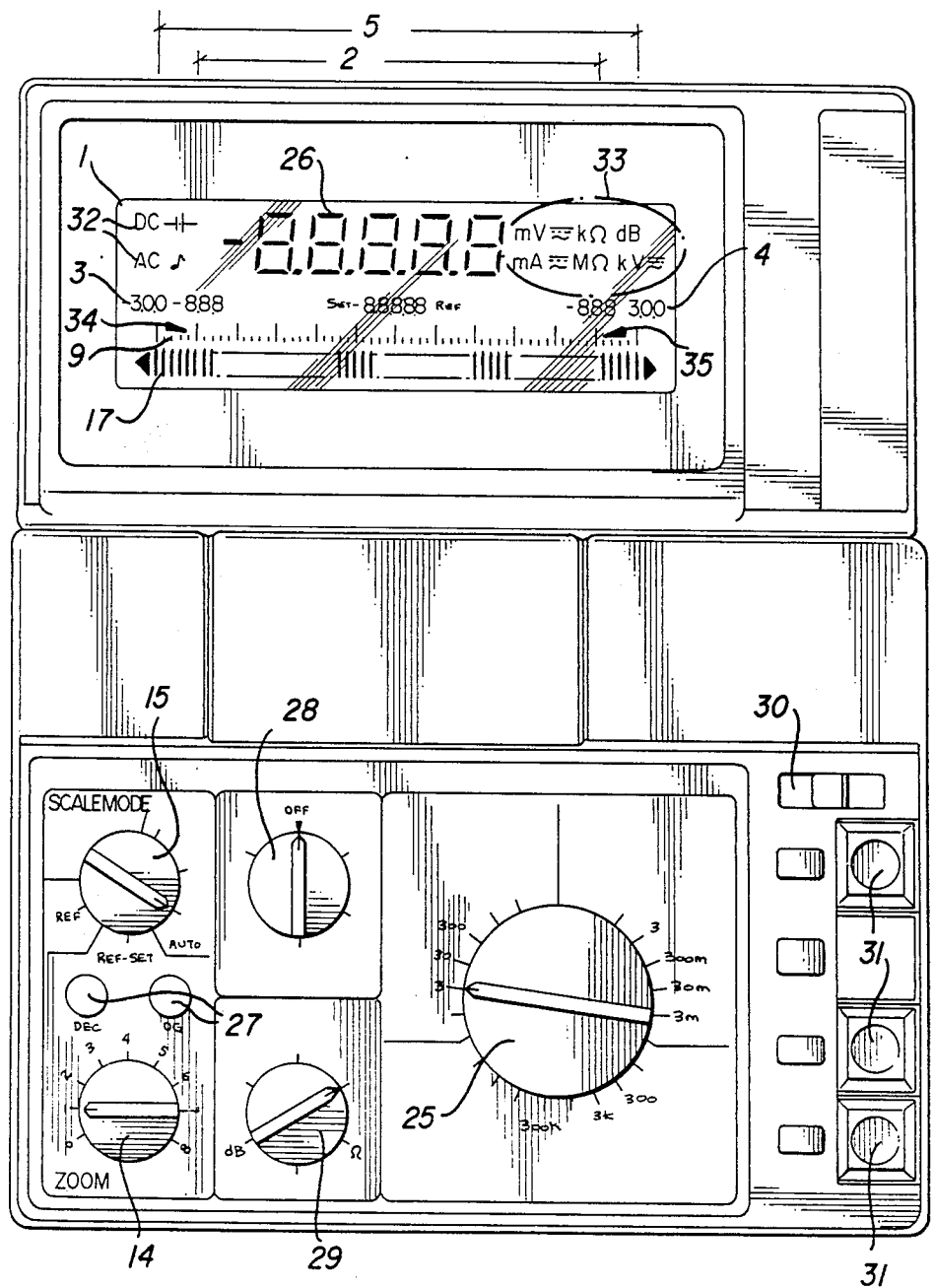
FIG. 1 is a diagrammatic top-plan view of a display and control element of a multiple measuring device.

Referring now to the figures of the drawings in detail and first particularly to FIG. 1 thereof, there is seen a multiple measuring device having a display 1 constructed from liquid crystals for the indication of measuring values, as well as several switches and buttons for setting different parameters influencing the display. The display indicates respective measurement values through the use of a large-area numerical display 26 and additionally through the use of a quasi-analog scale 9.

On the scale 9, an overall measuring range 5 and a spread measuring range section 2 are shown. The scale 9 has a linear scale division throughout, not considering the fact that a compression compensating the spreading of the scale is obtained for the overall scale outside the measuring range section. The compressed range is clearly distinguished from the spread region by triangular marks 34, 35.

The impression of a magnifier is therefore also generated between the tips of two triangular marks 34, 35 which leads to a spread display of the measuring range section 2. As can be seen especially clearly from FIG. 3, planar segments are disposed below the scale. The segment closest to the measurement value is addressed so that the appearance of the moving pointer is generated.

Figure 2:
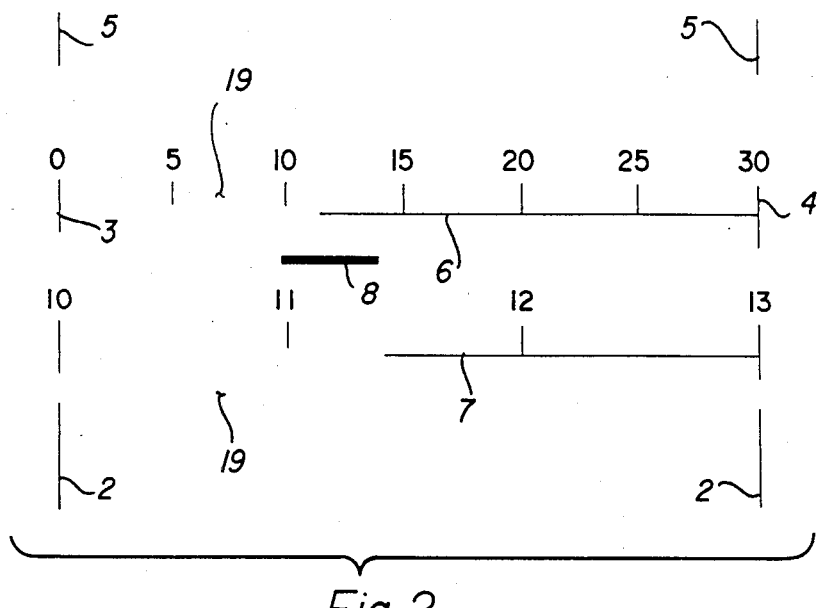
FIG. 2 is a top-plan view of a section of the display on which a scale for the overall measuring range and a scale for the measuring range section are shown.

However, the measurement value can also be displayed by a display beam 19, as is shown in FIG. 2.

In the embodiment according to FIG. 2, two scales 6, 7 are mutually parallel and disposed one above the other on a display. One scale 6 indicates the overall measurement range and the other scale 7 indicates a measurement range section 7. For the purpose of selecting as well as for visualizing the measuring range section 7, a cursor 8 is inserted in parallel to the scale for the overall measurement range 6; the position and width of the cursor defines the measurement range section 7.

Figure 3:
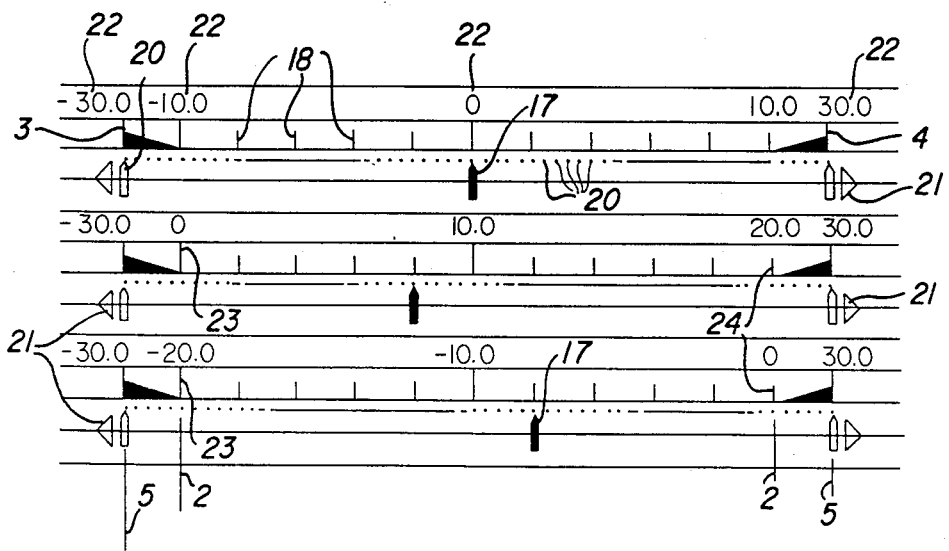
FIG. 3 is a top-plan view of a display of three scales, all of which represent the overall measuring range and a measuring range section on a common scale, but differ by the configuration of the respective measuring range section.

Through the combination of the overall measuring range 5 and the measuring range section 2 shown on a common scale in FIG. 3, the amount of technical means required for addressing simulation or circuitry is reduced quite considerably. In addition, the overall reading can be seen at a glance without the need for the eye to change from one scale to another. The measurement range section is always disposed in such a way that its central value lies in the center of the scale. According to FIG. 3, this main value reaches a value 0 for the first scale while the measuring range section thereof is between $-10.0$ and $+10.0$; the measurement range section is between 0 and $+20.0$ for the second scale while the mean value reaches 10.0; and the measurement range section of the third scale is between $-20.0$ and 0, with a mean value of $-10.0$. In order to keep the amount of control means low, five scale values are indicated as a maximum by numerals 22. Among them are a scale starting value 3 and a scale ending value 4 of the overall measuring range 5, a scale starting value 23 and a scale ending value 24 of the measuring range section 2, as well as central scale value.

The scale has a fixed scale division with only 13 scale lines distributed over the overall measuring range. This number of scale lines is particularly advantageous for scales with a three-division. In the present example, most measuring ranges require switching by three decades. If it is first assumed that a spreading factor of 1 is chosen for the measuring range section, the division in threes applies throughout the entire measuring range. In this case, there is no separation between the overall measuring range and the measuring range section and the triangular marks 34, 35 are also blanked out.

Eleven division lines are provided independently of the chosen spreading factor for the measuring range section. The eleven scale divisions, including a sixth one which is located at the center of the scale, are particularly well suited for an ending value of one, two, four or five. If such an ending value is to be provided in the case of an overall measuring range, the overall scale is limited to eleven scale divisions, by blanking out the first and last of the thirteen scale divisions if a spreading factor of one is provided. For larger spreading factors, thirteen scale divisions can also be used for a division with ones, twos, fours and fives.

Sixty-one planar segments 20 fall onto the thirteen scale divisions, each of which can mark the position of the measurement value pointer. With respect to the eleven scale divisions of the measuring range section, there are still fifty-one planar segments 20 for the pointer position.

It is very advantageous, especially for trimming problems, if any desired reference value can be set in the middle of the scale, to which the measurement value then must be set. Since such a reference value can be a "crooked" fractional value with several digits behind the decimal point, the value would interfere with the given fixed scale division. The measurement scale section is therefore not provided with nominal scale values for reference values given in the middle of the scale, but with plus/minus values which relate to the reference value and to which the scale division can be adapted.

Peculiarities of addressing the display can arise in the transition region from the measurement range section to the overall measurement range. If the starting or ending value of the overall measuring range coincides with the starting or ending value of the measuring range section, the value of the overall measuring range which is always equal is blanked out and the scale is shortened by one scale division. If a measuring value section is chosen which goes partly beyond the limits of the overall measuring range, such as due to a corresponding reference value input, the measurement value indication jumps first to the ending value of the overall measuring range and then to the overflow mark 21.

As is shown in FIG. 1, the spreading of the measuring range section can be set by a zoom switch 14. In the measuring range section, the zoom position 0 corresponds to a spreading factor 1. An automatic control is provided in order to find the measuring range section in which a measurement value happens to lie. The automatic control follows the measurement value and, for a given spreading factor, always displays the measuring range section in which the instantaneous measurement value falls approximately on the center of the scale. In the case of a continuous switching of the measuring range section, such as in the case of a continuously increasing measuring value, the switching therefore does not continue from the end of the scale to the start of the scale of the next measuring range section, but it continues to the middle thereof, i.e. only by one half of a measuring range section.

An additional measure for preventing undesirable switching back and forth between two adjacent measurement range sections with an oscillating measurement value, is the use of a timing switch 15. The timing switch 15 enables a time to be adjusted by which the switching of the measurement range section can be delayed. It is then necessary to wait to see whether or not the measurement value does not return into the starting position, before the switching takes place.

The timing switch 15 is designated in FIG. 1 in a scale mode, because it has additional switching positions for entering and adjusting a reference value. The adjustment is then at the position "REF-SET" by a reference value input key 27. A measurement range and measuring quantity switch 25 is combined with a type of measurement switch 29 which also permits checking of the battery voltage.

An acoustic signal can be given by a signal switch 28. The signal is released depending on the switching position, if the measurement value is larger or smaller than the set reference value. The switch 28 permits a change of a frequency or pulse in the position "VCP, through which an approach of the measurement value to the set reference value or the change of the absolute measurement value, is indicated acoustically. The "on" switch 30 serves for switching on the measuring device and jacks 31 serve for connecting the measuring lines.

Figure 5:
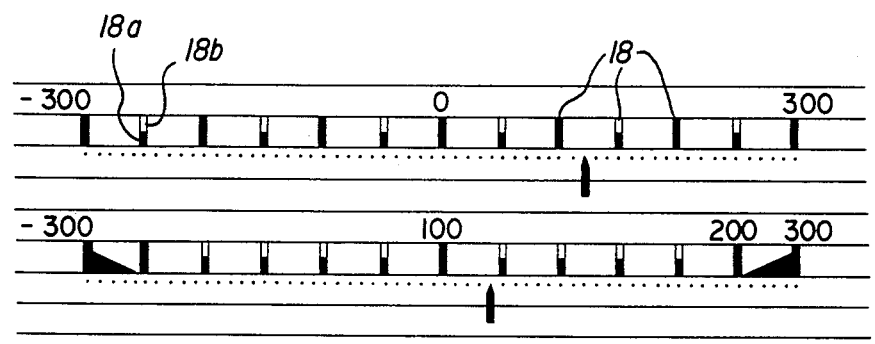
FIG. 5 is a top-plan view of the placement of separately addressable planar segments for displaying different scale divisions.

Since the costs of the measuring device depend substantially on the required technical means for addressing the display, the number of the individually addressable planar segments is reduced to the necessary minimum. The basic structure of the scale is fixed for this purpose. As FIG. 5 shows, however, the length of the scale divisions 18 and the scale subdivision, which is limited thereby, can be influenced. For this purpose, the scale division lines are formed of two separate area segments 18a, 18b. While all of the area segments 18a are addressed jointly, the area segments 18b can be displayed individually in accordance with the desired scale division.

In the case of a spreading factor preselected by the zoom switch 14, the spread of the measuring range sections does not generally directly fit the preselected scale division. Therefore, an automatic scale adapter ensures that adaption to the scale is accomplished by a fine adjustment of the spreading factor.

Figure 4:
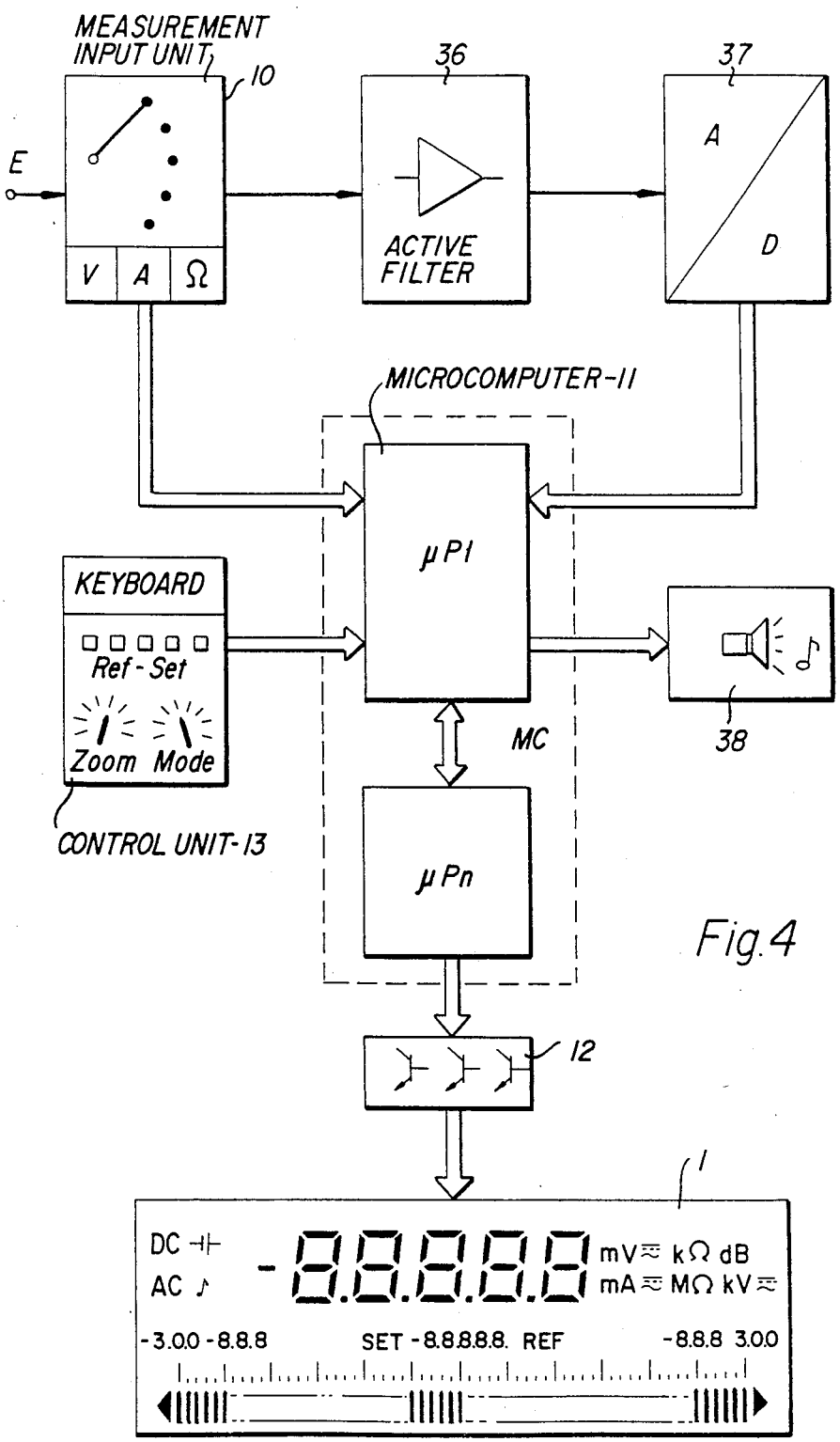
FIG. 4 is a block diagram of the measuring device.

As shown in FIG. 4, the measuring device has a microcomputer 11 with at least one microprocessor which evaluates the measurement data coming from a measurement input unit 10 in conjunction with the parameters given at a control unit 13, especially for the scale. and the reference values. The microprocessor recalculates the data and feeds the processed measurement data to the display 1 as control signals, through a display driver 12. Data may be entered into the microcomputer directly from the measurement value input unit 10. However, data may also be entered after conversion of the signals coming from the measurement value input unit in a buffer and RMS-value converter or matching circuit 36 as well as in an A/D converter 37 connected thereto. The microcomputer also has an output for a reference sounder or speaker 38 for giving acoustical signals.

Figure 6:
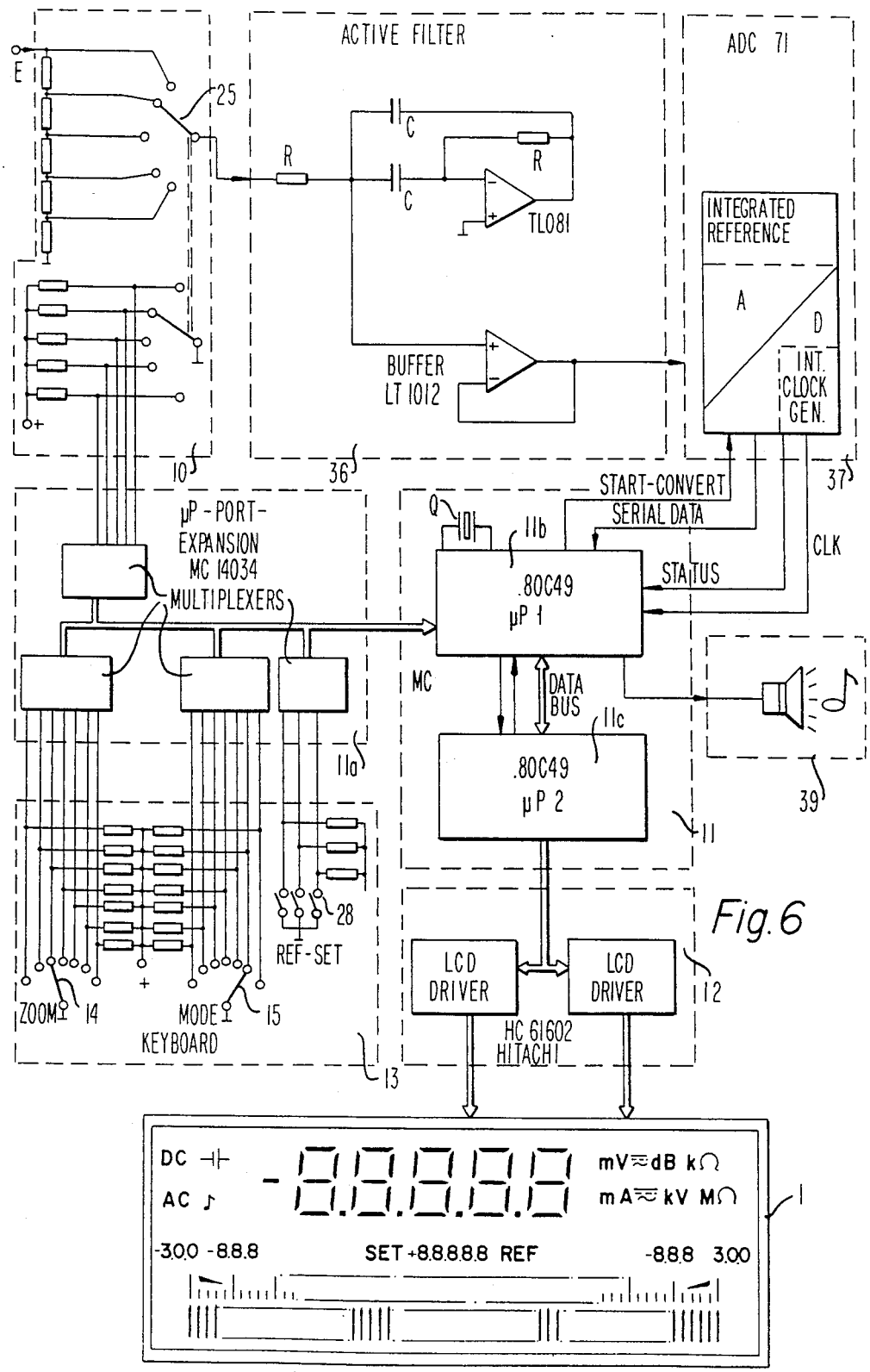
FIG. 6 is a more detailed block diagram of the measuring device.

An especially advantageous embodiment of the construction shown in FIG. 4 is seen in FIG. 6. Since the individual building blocks are well known and conventional, only their basic function is indicated. Unnecessary details, not needed for the understanding of the invention, are not shown. Therefore, the two FIGS. 1 and 6 do not correspond exactly in regard to the number of switch positions of the measuring range switch 25. The inclusion of all the modes of operation covered in the description hereinabove would not be possible and are not necessary for illustrating the invention.

The measurement input unit 10 includes a measurement range switch 25 that, by means of voltage dividers, matches the input signal E to an active filter 36 connected thereto. The filter 36 is a lowpass filter of the second order and serves to emulate the dynamic characteristics of a moving-coil meter. It has an upper cut-off frequency of approximately 2 Hz. The operational amplifier being part of the low-pass filter, may for example be of the type TL 081 from the firm Texas Instruments, has good dynamic characteristics and offers only low loading of the voltage dividers. The second operational amplifier, coupled as a buffer amplifier, which may be a TI type LT 1012, does not have to have any particular dynamic characteristics, but provides low bias or off-set distortion. The connection of the first operational amplifier with RC-circuits provides suppression of ac-voltages, so that only dc-voltage is present at the output of the active filter. In case an ac-signal is to be measured, the active filter must be switched to another configuration, so that the input signal E is connected to an effective value converter, which generates a dc-voltage that is proportional with the effective value of the ac-voltage to the filter 36.

Following the filter 36, the measuring signal is connected to a 16-bit analog-to-digital converter (A/D converter) 37 (e.g. a type ADC 7 1 from the firm Analog Devices), which performs at least 20 measurements per second. The reference voltage source is already included in this A/D converter, as well as the clock generator, that provides clock and status signals, corresponding to the conversion rates, to a microcomputer 11, connected thereto.

The microcomputer 11 includes in the present case a port expansion 11a, a first microprocessor 11b and a second microprocessor 11c. The microcomputer 11 controls, in response to an associated control program the complete measuring operation of the measuring device. The first microprocessor 11b communicates, to one side, with the A/D converter 37, and to the other side, via the port expansion 11c with the measurement input unit 10 and the control unit 13. In case valid measurements are available from the A/D converter 37, a command is generated from the quarz timing-controlled first microprocessor 11b via start-convert lead for serially reading the data of the values of the measurements.

Further, a composite switch-word is transmitted via the port expansion 11a to the first microprocessor 11b. The composite switch-word includes six bytes, including in turn the position of the measurement range switch 25 of the measurement input unit 10, the zoom switch 14, the mode switch 15 and the reference-set switch 28. From the composite switch word, two bytes which include the measured value data and two bytes, which include control data are transmitted to the second microprocessor 11c, as soon as these data are available. The port expansion 11a makes it possible to concentrate, by means of multiplexing, the multiplicity of switch positions represented by the switch word to a few inputs of the first microprocessor 11b.

The operation of the switches in the control unit 13 were already described in detail hereinabove, and accordingly, the zoom switch 14 controls the scale expansion, the mode switch 15 controls the enabling of the automatic scale selection, which provides delay times of 1, 2 or 5 seconds for scale-switching and enables the Ref-Set switch 28 to enter reference values by means of the reference-value-enter keys 27, shown in FIG. 1. Also connected to the first microprocessor 11b is a loudspeaker or sounder 38, which emits an acoustic signal e.g. as soon as the lower or upper reference values are reached or passed. By case of changes in the signal frequency, it can also operate to indicate the approaching or separation from a reference value.

Both microprocessors 11b and 11c may be of the type 80 C 49 from NEC. The major part of displaying the measurement values on the display 1 is performed by the second microprocessor 11c. The latter is, to one side, connected with the first microprocessor 11b via a data bus and control leads, and provides, in accordance with its control program instructions to an LED-display driver, e.g. of the type HC 61602 from Hitachi, which, in turn, control the segments of the LCD-display 1.

The program for the second microprocessor 11c is a chain of logic steps for enacting the inventive concept. The writer of the program decides the sequence of the individual logic steps. As an example, a program is shown in FIGS. 7-10 in pictorial form. The program shows steps 1.1 to 18.2, wherein the numerals 1 to 18 shows the program divided into larger steps. These steps are, briefly stated:

1. Initializing the LCD-display driver and display test to verify the operation of all the display segments 1.
2. Generating the first reference values for the measurement range section (zoom scale) by means of constructing the mean value from eight measurement values.
3. Erasing the display.
4. Evaluating the switch-word and indicating the measurement range, the type of current (ac or dc) and scale division.
5. Computing and indicating the first measurement sections (see sub-program 13–17).
6. Initializing the forming of the mean value for digital display and range section.
7. Entering the data (measurement value, control data and switch word) from the first microprocessor 11b.
8. Generating the values for the measuring range section from reiterative forming of the mean value. The duration for forming the mean value depends on the selected delay time at the mode switch 15 at the control unit 13.
9. Deciding logically the switching of the measuring range section and computing a new scale therefor.
10. Positioning the pointers 17 for indicating the instant measurement value.
11. Testing the switch word to determine if it is changed and if resulting branching is indicated.

SUBPROGRAM FOR SELECTING THE MEASURING RANGE SECTION

12. Computing the mean scale value for selecting the proper scale.
13. Erasing the left hand part of the scale when the measuring range section is at the lower end of the range or else display the left-hand part of the scale.
14. Erasing the right-hand part of the scale, when the measuring range is at the upper part of the range, or else set the display.
15. Computing the scale divisions.
16. Correcting the scale values, in case of zoom steps 3 and 6, such that the unit-position or respectively the one-tenth position is set to the limit value zero.
17. Displaying the scale values; in case of zoom values 3 and 6, and suppressing the middle number.

Figure 7:
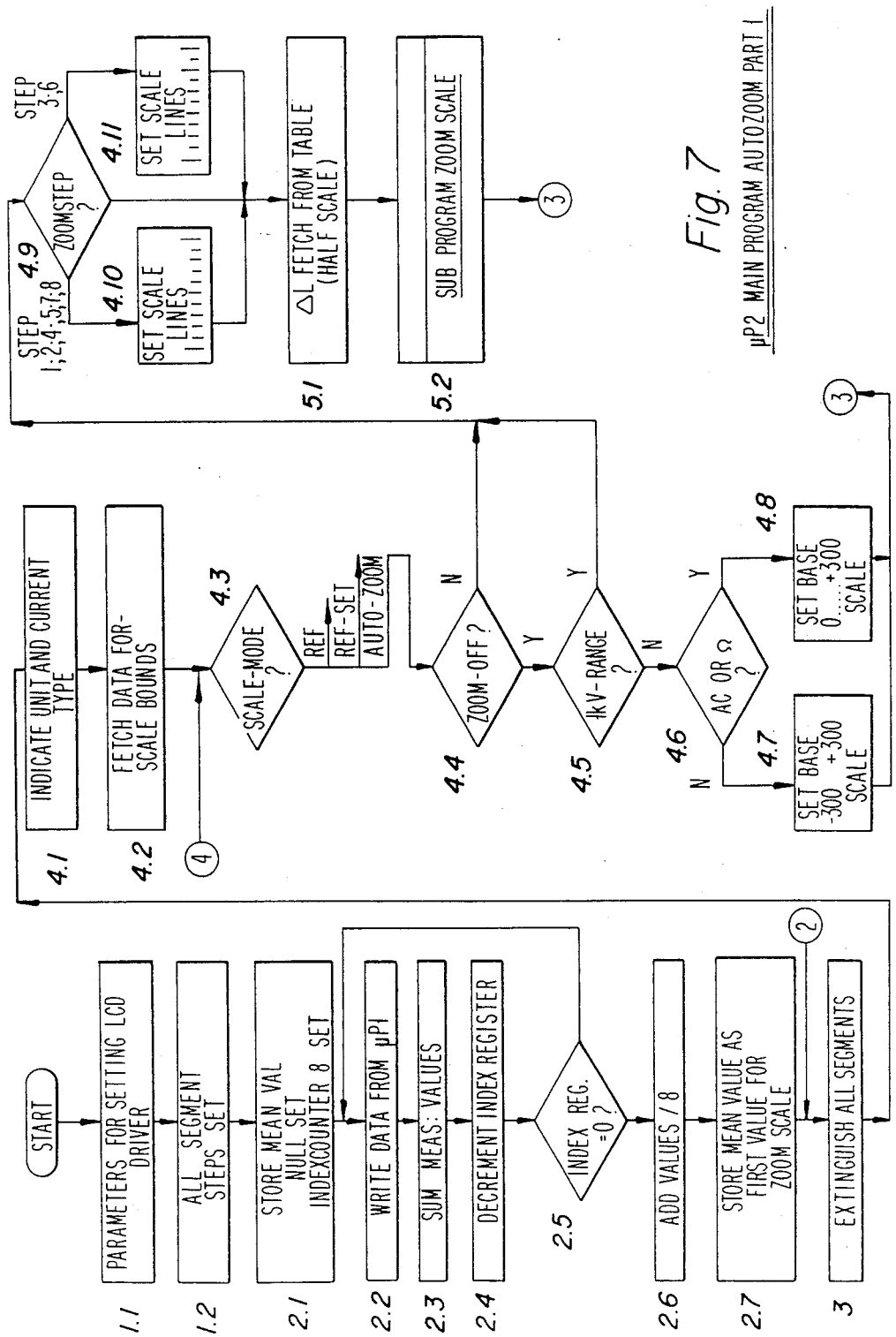
FIGS. 7, 8, 9 and 10 are flow-charts showing various operations of the device in step-by-step-form.
Figure 8:
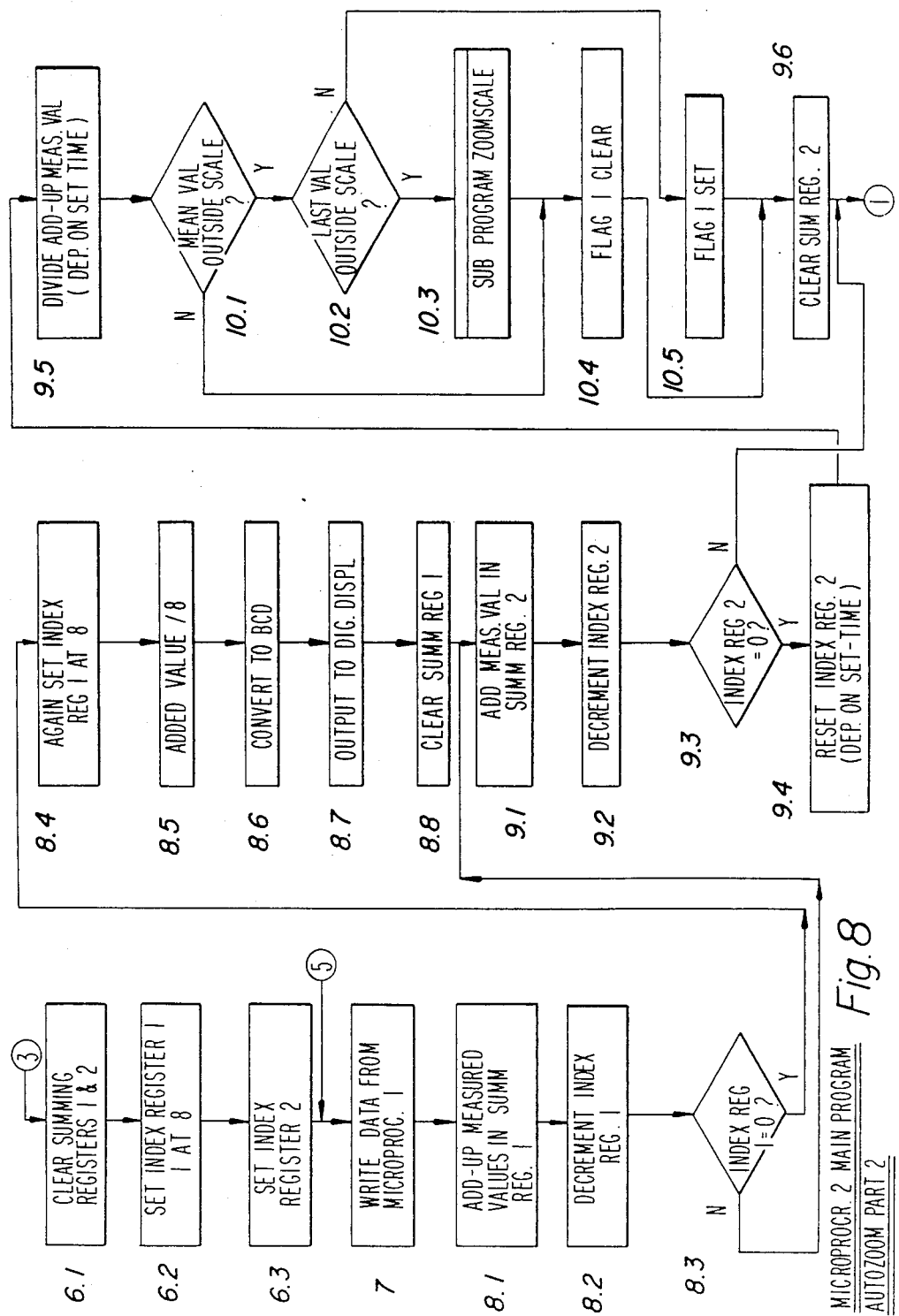
Figure 9:
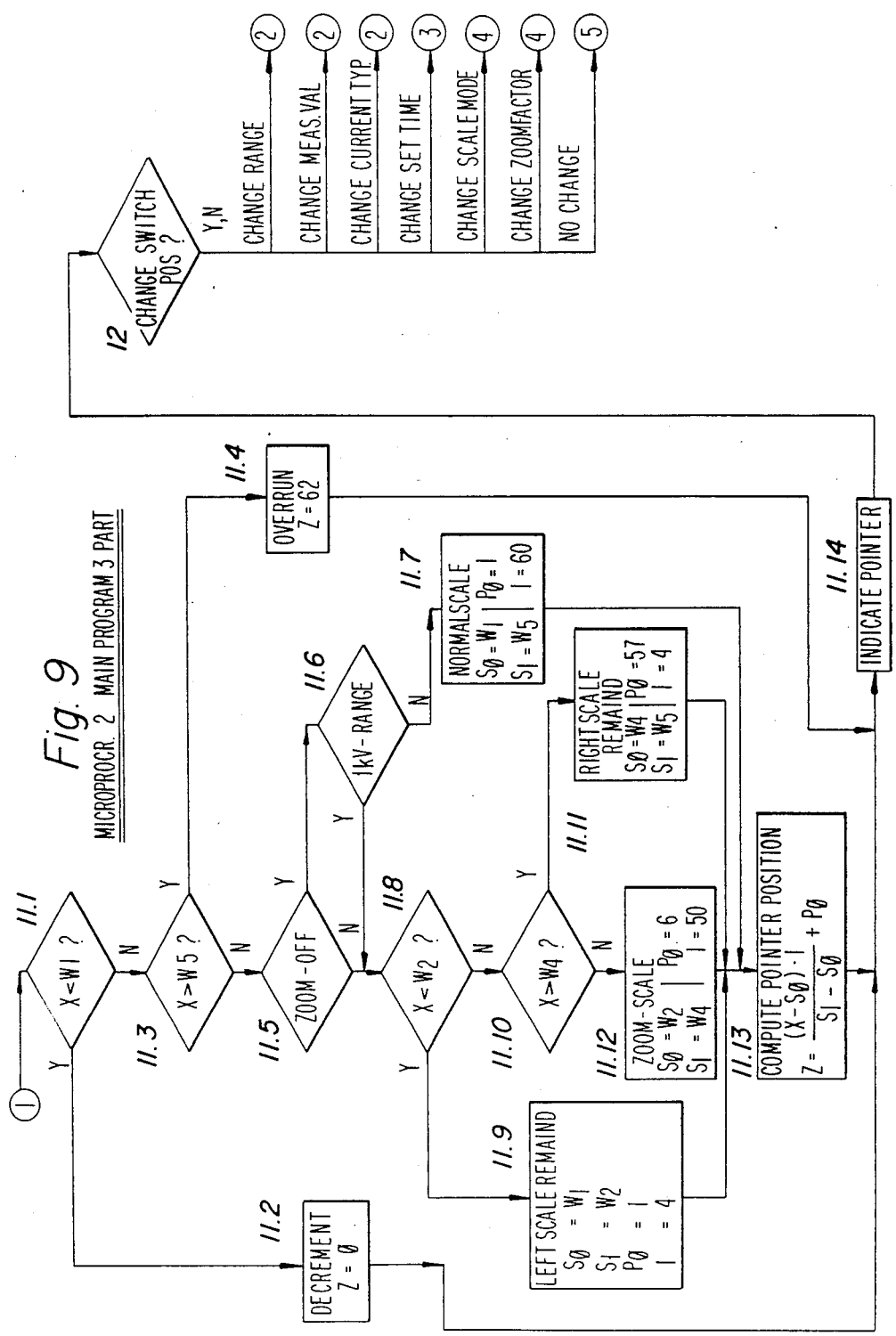
Figure 10:
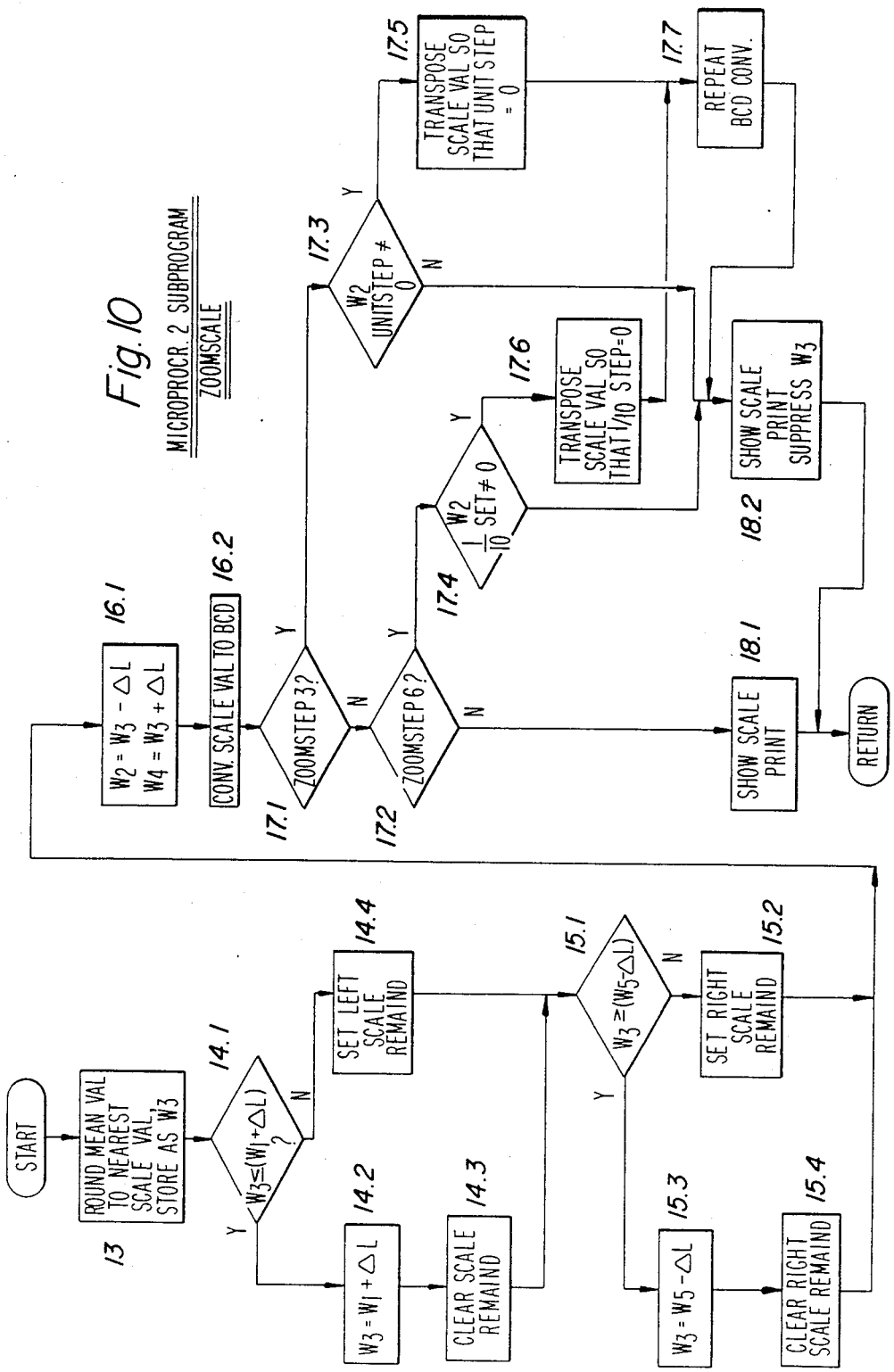
Figure 11:
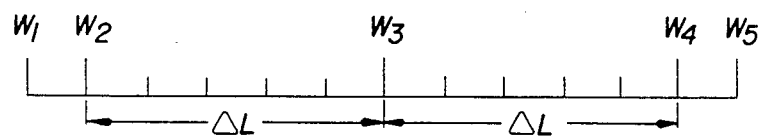
FIG. 11 is a diagrammatic drawing of a scale showing the boundaries of the overall measuring range, the spread measuring range section and the center point.

In order to understand the detail programs, shown in FIGS. 7 and 10, and especially for computing the scales for the various measuring ranges and measuring range sections, as well as the corresponding pointer positions, the following facts must be understood:

The scale, as seen in FIG. 11, consists of four display intervals, designated by the limits W1 to W5. In the interval W1–W2 is seen on the left-hand part of the scale; in the interval W4–W5 is seen the right-hand part of the scale.

The measuring range section, that is the zoom scale, is positioned between W2 and W4, so that delta L ($\Delta L$) corresponds to half of the measuring range section. By establishing the scale, the mean value W3 is used as the point of start.

Figure 12:
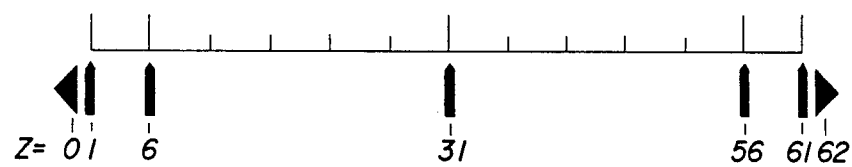
FIG. 12 is a diagrammatic drawing including the scale of FIG. 11, further including planar segments of the pointer segments.

FIG. 12 shows the possible positions that may be assumed by the pointer. The pointer position is indicated by letter Z and can have values between 0 and 62. In the pointer positions, overshoot marks indicate overshooting of the scale. Further definitions are:

Actual measuring value: X
Scale-begin value: So
Scale-end value: S1
Scale begin point: Po
Scale length in points: 1

It follows that since the overall measuring range as well as the measuring range section and the pointer position are changeable, a relatively complicated program is required. The second microprocessor 11c two summing registers and two index registers. The summing register 1 is used for forming the mean values from eight measuring values for the digital display, and whereby the index register is used for counting the number of added values stored in the summing register.

The summing register 2 is used to form the mean values for the measuring range section (zoom-scale) on basis of the selected switching delay time, whereby the index register 2 is used to count the number of measurement values added in the summing register 2. The reiterative forming of the mean values within the given time for establishing the zoom-scale is called the acquisition time.

Flag 1 is a program marker that is set at the moment a mean value from the summary register 2 falls outside the zoom-scale. In case the next mean value falls inside the zoom-scale, the flag 1 is reset (cleared), or else, the scale is switched to the next value.

In order to explain the symbols shown in the display, it should furthermore be noted that all of the planar segments which can be addressed overall, are shown in FIGS. 1 and 4. Since the symbols are not shown on the display by a matrix control but by addressing individual planar segments corresponding to the respective symbols, the symbols cannot be made visible selectably on top of each other at the same point, but only selectably side by side. During practical operation, only one of the symbols shown is inserted, of course, for the indication 32 of the type of current and for the indication of the measuring quantity 33. The same also applies for the numerals 22, 26, which if all seven segments are addressed, always result in a figure eight and for the pointer marks 17, of which only one is addressed individually or several are addressed as a band.

We claim:

1. Digital measuring device for measuring and displaying a measurement value, comprising:
    a numerical measurement value display;
    a predetermined overall measuring range;
    a quasi-analog measurement value scale disposed forming a spread measuring range within said predetermined overall measuring range;
    a plurality of addressable planar segments disposed in parallel with said quasi-analog measurement value scale, having a alphanumeric lettering to indicate said spread measuring range section on said measurement value scale;
    indicating means for said measurement value scale for indicating a value thereon;
    automatic control means for automatically changing said spread measuring range by a given spreading factor until the measurement value is disposed between the limits of said spread measuring range and wherein said overall measuring range remains constant.

2. Digital measuring device according to claim 1, wherein said indicating means is a pointer mark.

3. Digital measuring device according to claim 1, wherein said indicating means is a bar indication.

4. Digital measuring device according to claim 1, wherein said automatic control means operates to select said spreading factor.

5. Digital measuring device according to claim 1, wherein said measuring range has given lower and upper limits, and said automatic control generates a switching signal when one of said limits is exceeded, causing switching of the spreading factor of said measuring range section and causing the measurement value to be placed substantially in the middle of said measurement value scale.

6. Digital measuring device according to claim 1, including a timing circuit for delaying the automatic changing of the spreading factor of said measuring range and a selector switch for selectively setting the delay time in steps.

7. Digital measuring device according to claim 1, including a timing circuit for delaying the automatic switching of said spreading factor of said measuring range section, and a potentiometer for setting the delay time with a continuous adjustment.

8. Digital measuring device according to claim 1, wherein said automatic control means operated to optimize said spreading factor upon command, determines a change of the measurement value per unit time and spreads said spread measuring range only so far that the measured value does not exceed said measurement range in a predetermined period of time with the same rate of change.

9. Digital measuring device according to claim 1, wherein said scale has a reference value set in the center thereof, and said automatic control means operate to position said spread measurement range on two sides of said reference value and selects said spreading factor in steps, placing the measurement value within said spread measuring range at the greatest possible distance from said reference value.

10. Digital measuring device according to claim 1, wherein said given spreading factor has a quantity of steps and spacings therebetween and wherein said spreading factor has a maximum value, and is manually selectable.

11. Digital measuring device according to claim 1 including another scale parallel with said measurement value scale, having disposed within said overall measuring range and said spread measuring range, said overall measuring range having scale starting and ending values, said spread measuring range section being centered in said other scale, at least one of said starting and ending values being disposed at respective sides of said center adjacent said measuring range section, and parts of said overall measuring range extending beyond said spread measuring range section being compressed.

12. Digital mesauring device according to claim 1, wherein said automatic control means are a microcomputer, and include a measuring value input unit for adapting the measurement value and delivering an output signal to said microcomputer for determining a range of parameters directly, a matching circuit connected to said measuring value input unit, and an A/D converter connected between said matching circuit and said microcomputer, said microcomputer converting the measured value into control signals required for activating said planar segments of said display, a display driver connected between said microcomputer and said display for feeding said control signals to said display, and a control unit connected to said microcomputer for entering parameters determining the measuring range, the spreading of said measuring range section and other parameters determining the addressing of said planar segments.

13. Digital measuring device according to claim 1, wherein said planar segments of said display have a shape adapted to given variations of said measurement value scale, said planar segments having partially contrasting areas, and include a common electrode and individual counter electrodes connected to said planar segments for addressing respective ones of said planar segments.

14. Digital measuring device according to claim 1, wherein said planar segments of said display have a shape adapted to given variations of said measurement value scale, said planar segments have partially contrasting areas, and include a plurality of counter electrodes connected to said planar segments for addressing said planar segments.

15. Digital measuring device according to claim 1, wherein said measurement value scale has a fixed scale division remaining constant independently of said overall spread measuring range and said measuring range the length of the scale divisions and the scale lettering are changeable, and non-variable parts of said scale are addressed jointly.

16. Digital measuring device according to claim 1, wherein said scale has a fixed scale division remaining constant independently of said overall spread measuring range and said measuring range the length of the scale divisions and the scale lettering are changeable, and non-variable parts of said scale are fixed by printing.

17. Digital measuring device according to claim 2, wherein said scale has division lines, said overall scale has a starting value and an ending value, said planar segments are addressable for showing said pointer mark and are mutually parallel, equidistant and disposed side by side from said starting value to said ending value, one of said planar segments are disposed at each respective scale division line, and further planar segments being disposed between said scale division lines.

18. Digital measuring device according to claim 1, wherein said spread measuring range is linearly spread, said overall measuring range is linearly compressed outside said spread measuring range, and include an overflow mark signalling if said overall measuring range is exceeded.

19. Digital measuring device according to claim 1, including numerals indicating starting and ending values of said spread measuring range and said overall measuring range and substantially the center of said scale, and said numerical value display has a substantially larger area than said lettering for indicating an instantaneous measurement value.

20. Digital measuring device according to claim 1, wherein said measurement value scale is divided into division lines, at least some of which are formed of two separately addressable line segments, said line segments serve to increase the length of a respective scale line when addressed together; the device including an automatic scale adapter causing the longer scale lines to lie at a point which assures an easily readable subdivision of the set measuring range when the measuring range is changed.

21. Digital measuring device according to claim 20, wherein said spreading factor is coarsely set automatically, and said automatic scale adapter finely adjusts said spreading factor causing the spread measuring range section being displayed to fit a fixed, predetermined, scale division.

22. Digital measuring device according to claim 20, wherein said line segments and scale values are selectably addressable causing the zero point of at least one of said overall measuring range and said measuring range section to lie at one of the start, center and end of said respective scale.

* * * * *